(12) United States Patent
Tang et al.

(10) Patent No.: US 10,317,586 B2
(45) Date of Patent: Jun. 11, 2019

(54) SUBSTRATE, COLOR FILTER MODULE, METHOD FOR FORMING SUBSTRATE MODULE AND DISPLAY DEVICE

(71) Applicants: BOE Technology Group Co., Ltd., Beijing (CN); Chengdu BOE Optoelectronics Technology Co., Ltd., Chengdu (CN)

(72) Inventors: Tao Tang, Beijing (CN); Tao Luo, Beijing (CN); Qingde Long, Beijing (CN); Zhiyong Zhang, Beijing (CN); Xuejie Bai, Beijing (CN); Wen Xiao, Beijing (CN); Zerong Yang, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 348 days.

(21) Appl. No.: 15/307,880

(22) PCT Filed: Jan. 20, 2016

(86) PCT No.: PCT/CN2016/071450
§ 371 (c)(1),
(2) Date: Oct. 31, 2016

(87) PCT Pub. No.: WO2017/016203
PCT Pub. Date: Feb. 2, 2017

(65) Prior Publication Data
US 2017/0153365 A1    Jun. 1, 2017

(30) Foreign Application Priority Data
Jul. 30, 2015    (CN) .......................... 2015 1 0459538

(51) Int. Cl.
*G02B 3/08*        (2006.01)
*G02B 5/20*        (2006.01)
(Continued)

(52) U.S. Cl.
CPC ........... *G02B 5/201* (2013.01); *G02B 3/0037* (2013.01); *G02B 5/045* (2013.01);
(Continued)

(58) Field of Classification Search
CPC ...... G02B 5/201; G02B 5/045; G02B 3/0037; G02F 1/133526
See application file for complete search history.

(56) References Cited

U.S. PATENT DOCUMENTS

| | | | |
|---|---|---|---|
| 8,045,103 | B2 | 10/2011 | Hayano et al. |
| 2001/0024222 | A1 | 9/2001 | Ohno et al. |

(Continued)

FOREIGN PATENT DOCUMENTS

| | | |
|---|---|---|
| CN | 1576961 A | 2/2005 |
| CN | 1591055 A | 3/2005 |

(Continued)

OTHER PUBLICATIONS

International Search Report and Written Opinion, including English translation of Box No. V of the Written Opinion, for International Application No. PCT/CN2016/071450, dated Apr. 27, 2016, 12 pages.

(Continued)

*Primary Examiner* — Joseph P Martinez
(74) *Attorney, Agent, or Firm* — Westman, Champlin & Koehler, P.A.

(57) ABSTRACT

Embodiments of the present invention relates to a thin film transistor and a method for manufacturing the same, a display substrate and a display device. The thin film transistor comprises an active layer, a source electrode, a drain (Continued)

electrode and an ohmic contact layer, wherein the ohmic contact layer is disposed between the active layer and the source electrode and/or between the active layer and the drain electrode to improve an ohmic contact property of the active layer with the source electrode and/or the drain electrode. The present invention solves the problem of poor ohmic contact effect between the active layer and the source and drain electrodes in the existing thin film transistor, thereby improving the ohmic contact property of the active layer with the source and drain electrodes and meanwhile improving display effect of images of a display.

17 Claims, 19 Drawing Sheets

(51) Int. Cl.
    *G02B 3/00*     (2006.01)
    *G02B 5/04*     (2006.01)
    *G03F 7/00*     (2006.01)
    *H01L 27/12*     (2006.01)
    *G02F 1/1335*     (2006.01)
    *G02F 1/1333*     (2006.01)

(52) U.S. Cl.
    CPC .. *G02F 1/133514* (2013.01); *G02F 1/133526* (2013.01); *G03F 7/0007* (2013.01); *H01L 27/124* (2013.01); *H01L 27/1218* (2013.01); *G02F 2001/133302* (2013.01)

(56) References Cited

U.S. PATENT DOCUMENTS

| | | | |
|---|---|---|---|
| 2002/0008916 A1* | 1/2002 | Nishikawa | G02B 3/0018 359/619 |
| 2002/0101552 A1 | 8/2002 | Yi et al. | |
| 2014/0055878 A1 | 2/2014 | Niu | |

FOREIGN PATENT DOCUMENTS

| | | |
|---|---|---|
| CN | 1722361 A | 1/2006 |
| CN | 101329468 A | 12/2008 |
| CN | 101344607 A | 1/2009 |
| CN | 101517439 A | 8/2009 |
| CN | 102789089 A | 11/2012 |
| CN | 102830535 A | 12/2012 |
| CN | 103246107 A | 8/2013 |
| CN | 103278873 A | 9/2013 |
| CN | 203269786 U | 11/2013 |
| CN | 203658705 U | 6/2014 |
| CN | 204130537 U | 1/2015 |
| CN | 105158829 A | 12/2015 |

OTHER PUBLICATIONS

Second Office Action, including Search Report, for Chinese Patent Application No. 201510459538.3, dated Sep. 14, 2017, 17 pages.
First Office Action, including Search Report, for Chinese Patent Application No. 201510459538.3, dated Feb. 23, 2017, 23 pages.

* cited by examiner

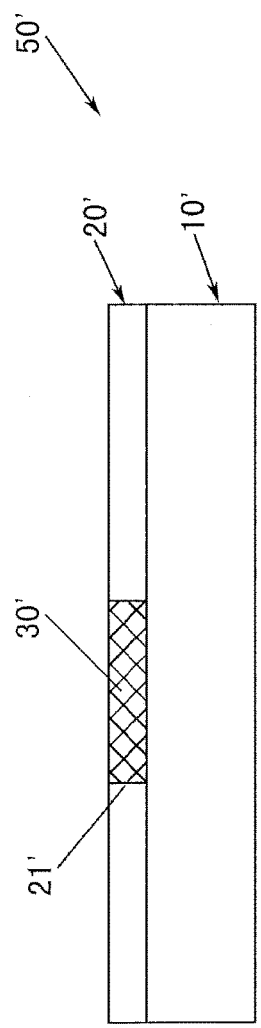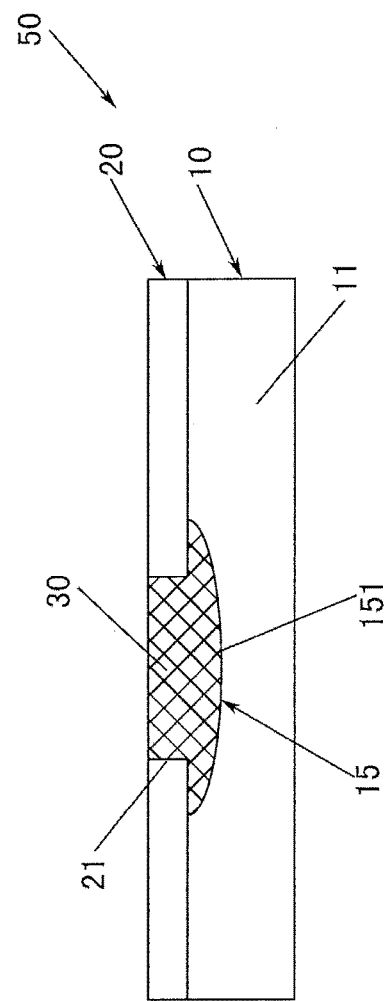
Fig. 14
Fig. 15

SUBSTRATE, COLOR FILTER MODULE, METHOD FOR FORMING SUBSTRATE MODULE AND DISPLAY DEVICE

CROSS REFERENCE OF RELATED ART

The present application is a Section 371 National Stage application of the International Application No. PCT/CN2016/071450, filed on Jan. 20, 2016, which claims priority to Chinese application No. 201510459538.3, filed on Jul. 30, 2015, with the State Intellectual Property Office of China, both of which are incorporated herein by reference in their entirety.

BACKGROUND OF THE INVENTION

Field of the Invention

Embodiments of the present invention relate to a substrate for a display device, a color filter module for a display device, a method for forming a substrate module of a display device and a display device.

Description of the Related Art

A traditional display device usually uses a separate optical device to realize various effects.

SUMMARY OF THE INVENTION

Embodiments of the present invention provide a substrate for a display device, a color filter element for a display device, a method for forming a substrate module of a display device and a display device, thereby simplifying a structure of the display device.

According to an aspect of the present invention, there is provided a substrate for a display device, comprising a substrate body and a plurality of optical devices, the plurality of optical devices are formed by a plurality of recesses formed on a surface of the substrate body and spaced apart from each other.

According to the above technical solution of the present invention, through forming the optical devices on the substrate body itself, no separate optical module thus is necessary, thereby simplifying the structure of the display device, reducing size the display device, and ensuring performance stability and reliability of the display device.

According to an exemplary embodiment of the present invention, the plurality of recesses are formed as a plurality of concave lenses arranged into an array.

According to the above embodiment, the lights from the display device may be more divergent and the display device may have wider angle of view by using the concave lenses.

According to an exemplary embodiment of the present invention, the plurality of optical devices is a plurality of prisms.

According to the above embodiment of the present invention, images of the display device may be viewed at a specific angle by using the prisms, and the display device thus may be applied to a specific use.

According to an exemplary embodiment of the present invention, the plurality of prisms are arranged into an array.

According to an exemplary embodiment of the present invention, the display device comprises a plurality of sub-pixels to which the plurality of optical devices correspond in position respectively.

With the above structure, the optical devices correspond to the sub-pixels in position respectively, and filter elements corresponding to pixels thus can be arranged within the recesses, thereby further reducing the size of the display device.

According to an exemplary embodiment of the present invention, each recess has a substantially rectangular shape or an elongated strip shape when viewed in a direction substantially perpendicular to the substrate body.

According to another aspect of the present invention, there is provided a color filter module for a display device, comprising the substrate as described above and a plurality of filter elements arranged to correspond to the plurality of recesses respectively, at least a portion of each filter element being arranged within a corresponding recess.

With the above structure, the optical devices are formed on the substrate body itself, thus no separate optical module is necessary. Further, at least a portion of each filter element is arranged within a corresponding recess, thereby further reducing the size of the display device.

According to an exemplary embodiment of the present invention, the color filter element for the display device further comprises a coating formed as a black matrix and formed with a plurality of through holes corresponding to the plurality of recesses in position respectively, wherein an inner periphery of each through hole is substantially coincident with an inner periphery of a corresponding recess when viewed in a direction substantially perpendicular to the substrate body.

According to an exemplary embodiment of the present invention, the color filter module for the display device further comprises a coating formed as a black matrix and formed with a plurality of through holes corresponding to the plurality of recesses in position respectively, wherein at least a portion of an inner periphery of each through hole is located inside an inner periphery of a corresponding recess when viewed in a direction substantially perpendicular to the substrate body.

With the above structure, since at least a portion of the inner periphery of each through hole is located inside the inner periphery of a corresponding recess, it is possible to ensure that light leaking will not occur.

According to an exemplary embodiment of the present invention, at least a portion of each filter element is arranged within a space surrounded by a corresponding recess and a corresponding through hole.

With the above structure, at least a portion of each filter element may be arranged within a corresponding recess, thereby further reducing the size of the display device.

According to further another aspect of the present invention, there is provided a method for forming a substrate module or a color filter module of a display device, comprising steps: providing a substrate; and forming a plurality of recesses spaced apart from each other on a surface of the substrate to form a plurality of optical devices.

With the above structure, it is possible to simplify the process for forming the optical devices so that an assembling process of the display device is simplified.

In the method according to an exemplary embodiment of the present invention, the step of forming a plurality of recesses spaced apart from each other on a surface of the substrate to form a plurality of optical devices comprises: forming a coating on the substrate and forming a plurality of through holes in the coating; and forming the plurality of recesses on the surface of the substrate through the plurality of through holes by etching.

According to the above embodiment of the present invention, the optical devices may have more reliable and stable quality through forming the plurality of recesses on the substrate itself by etching.

According to an exemplary embodiment of the present invention, the coating is formed as a black matrix of the display device.

According to the above embodiment of the present invention, by forming the optical devices by the coating formed as the black matrix, the optical devices may be formed only by adding a processing step, thereby saving cost and simplifying process.

According to an exemplary embodiment of the present invention, the etching step comprises supplying an etching solution from an upper edge of the substrate in a state where a side of the substrate formed with the coating faces upwards and the substrate is obliquely placed, so that the etching solution flows downwardly from the upper edge of the substrate along the surface thereof.

According to an exemplary embodiment of the present invention, the etching step comprises supplying an etching solution from an upper edge of the substrate in a state where the substrate is substantially vertically placed, so that the etching solution flows downwardly from the upper edge of the substrate along the surface thereof.

According to an exemplary embodiment of the present invention, the etching step further comprises injecting the etching solution toward the side of the substrate formed with the coating such that the etching solution in each through hole is subjected to a predetermined pressure.

According to an exemplary embodiment of the present invention, the etching solution is injected toward the side of the substrate formed with the coating by a plurality of nozzles.

According to an exemplary embodiment of the present invention, an injection direction of each of the plurality of nozzle is adjustable.

With the above embodiment, it is possible to ensure the quality of the recesses. For example, it is possible to ensure the quality of the recesses formed through capillarity.

According to an exemplary embodiment of the present invention, the method for forming the substrate module of the display device further comprises cutting away a portion of the coating inside an inner periphery of each recess when viewed in a direction substantially perpendicular to a substrate body along an inner periphery of each through hole.

According to the above embodiment of the present invention, it is possible to improve an aperture opening ratio of the display device by cutting away the portion of the coating inside the inner periphery of each corresponding recess when viewed in a direction substantially perpendicular to the substrate body along the inner periphery of each through hole.

According to an exemplary embodiment of the present invention, the method for forming the substrate module of the display device further comprises forming a filter element at least within a space surrounded by each recess and each corresponding through hole.

With the above structure, it is possible to ensure that light leaking will not occur.

According to an exemplary embodiment of the present invention, the step of forming a filter element comprises applying photoresist onto a side of the substrate formed with the coating so that the photoresist is filled in the space surrounded by each recess and each corresponding through hole, and irradiating the photoresist at a side of the substrate without the coating to expose and develop the photoresist, thereby forming the filter element.

With the above structure, each filter element has a flatter upper surface and a smaller height difference, thereby reducing possibility of light leaking.

According to an exemplary embodiment of the present invention, the plurality of optical devices are a plurality of concave lenses or prisms arranged into an array.

According to the above embodiment of the present invention, the light from the display device may be more divergent and the display device may have a wider angle of view by using the concave lenses. Further, images of the display device may be viewed at a specific angle by using the prisms, and the display device thus may be applied to a specific use.

According to yet another aspect of the present invention, there is provided a display device comprising the substrate as described above or the color filter module for the display device as described above.

According to the above technical solution of the present invention, through forming the optical devices on the substrate body itself, no separate optical module thus is necessary, thereby simplifying the structure of the display device, reducing the size and cost of the display device, and ensuring the quality and performance stability and reliability of the display device.

BRIEF DESCRIPTION OF THE DRAWINGS

FIG. 14 is a partial enlarged schematic view of a conventional color filter module; and FIG. 15 is partial enlarged schematic view of the color filter module according to an exemplary embodiment of the present invention;

DETAILED DESCRIPTION OF PREFERRED EMBODIMENTS OF THE INVENTION

Figure 1:
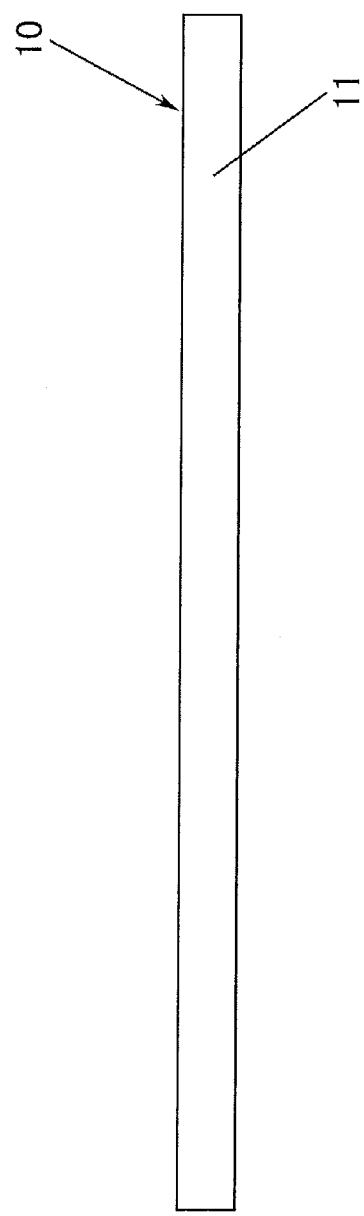
FIG. 1 is a schematic view of a clean glass substrate according to an exemplary embodiment of the present invention.

Embodiments of the present invention will be described with reference to the accompanying drawings.

Embodiments of the present invention will be clearly and completely described hereinafter in detail with reference to the accompanying drawings. In addition, in the below detail description, for easy to explain, many specific details are set forth to provide a complete understanding to the disclosure. However, one or more embodiments can be obviously carried out without these specific details. In other cases, well-known structures and devices are illustrated to simplify the drawings.

As shown in FIGS. 8 to 13 and 17 to 19, a substrate 10 for a display device according to an exemplary embodiment of the present invention comprises a substrate body 11 and a plurality of optical devices 15 formed by a plurality of recesses 151 formed on a surface of the substrate body 11 and spaced apart from each other. Through forming the optical devices 15 on the substrate body 11 itself, no separate optical module thus is necessary, thereby simplifying a structure of the display device, reducing a size thereof and ensuring performance stability and reliability of the display device. The display device comprises sub-pixels corresponding to the optical devices 15 in position respectively. Therefore, It is possible to dispose filter elements corresponding to the pixels in the recesses 151, thereby further reducing the size of the display device.

The substrate may be made of glass. Alternatively, it may also be made of other transparent materials.

According to an exemplary embodiment of the present invention, typically, each recess 151 may has a substantially rectangular or elongated strip shape when viewed in a direction substantially perpendicular to the substrate body 11. The present invention, however, is not limited thereto. Each recess 151 may also have a square shape, other polygonal or regular polygonal shapes. The shape of each recess 151 may be determined based on a shape of each sub-pixel.

As illustrated in FIGS. 8 to 13, 17 and 18, according to some embodiments of the disclosure, the optical devices 151 may be a plurality of concave lenses arranged into an array. The display device may have more divergent lights and wider angle of view by using the concave lenses.

Figure 19:
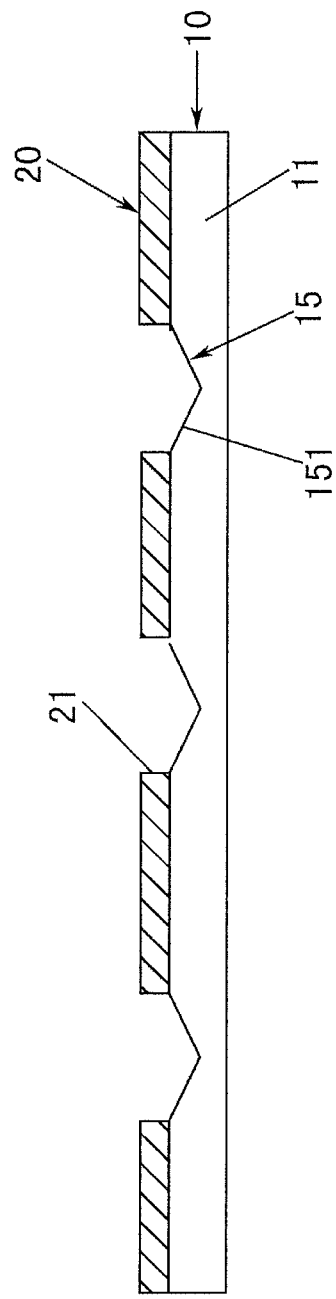
FIG. 19 is a schematic view of a glass substrate according to another exemplary embodiment of the present invention, wherein the glass substrate is formed with prisms and a black matrix.
Figure 20:
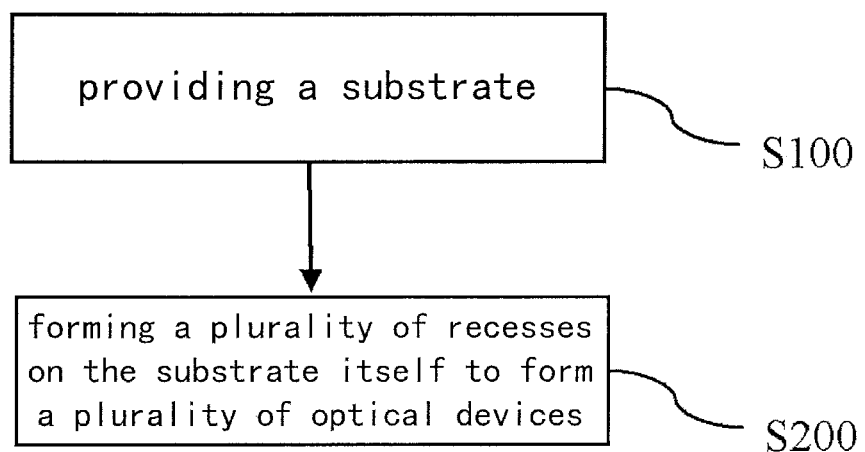
FIG. 20 is a flow chart of a method for forming a substrate module of a display device according to an exemplary embodiment of the present invention.

As shown in FIG. 19, according to some embodiments of the disclosure, the optical devices 151 may be a plurality of prisms arranged into an array. Images of the display device may be viewed at a specific angle by using the prisms, the display device thus may be applied to a specific use.

As an alternative, the optical devices 15 may also be any other suitable optical devices, such as micro-lenses, having various structures, to diverge, diffuse, deflect or converge light. Therefore, the optical devices 15 are not limited to those as described in the above embodiments of the present invention.

As shown in FIGS. 10, 13, 17 and 18, according to an exemplary embodiment of the present invention, there is provided a color filter module 50 for a display device comprising the substrate 10 as described above and a plurality of filter elements 30 arranged to correspond to the plurality of recesses respectively. At least a portion of each filter element is arranged within a corresponding recess 151. Through forming the optical devices on the substrate body 11 itself, no separate optical module thus is necessary. Further, at least a portion of each filter element is disposed in the corresponding recess 151, so that the size of the display device can be further reduced.

Figure 9:
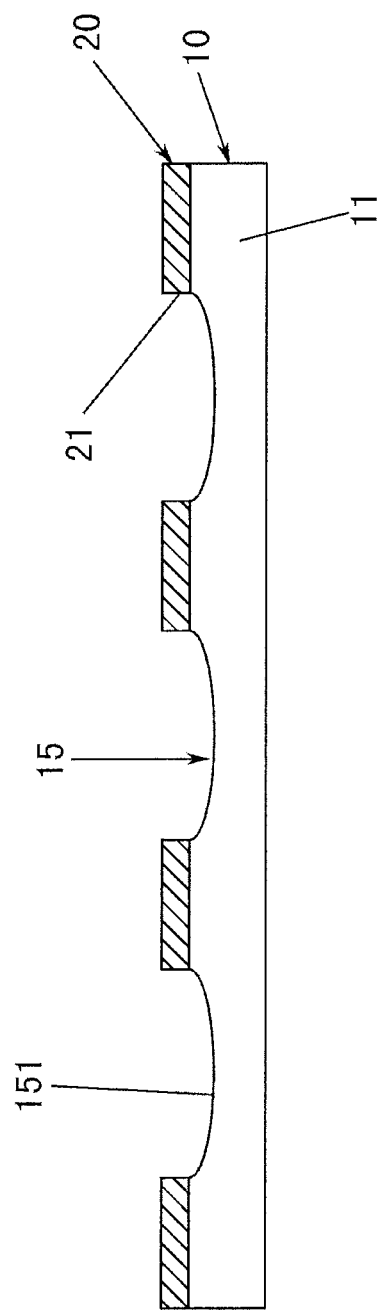
FIG. 9 is a schematic view of the glass substrate and the black matrix after cutting the black matrix according to an exemplary embodiment of the present invention.
Figure 10:
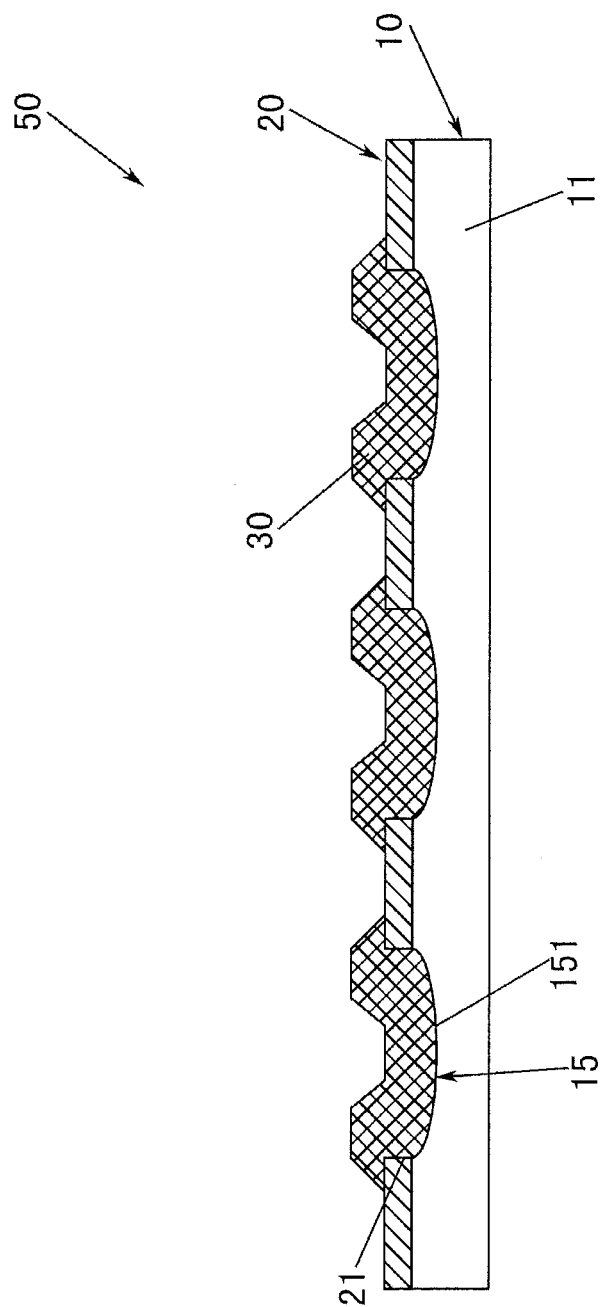
FIG. 10 is a schematic view of a color filter module formed through forming filter elements on the glass substrate according to an exemplary embodiment of the present invention.
Figure 17:
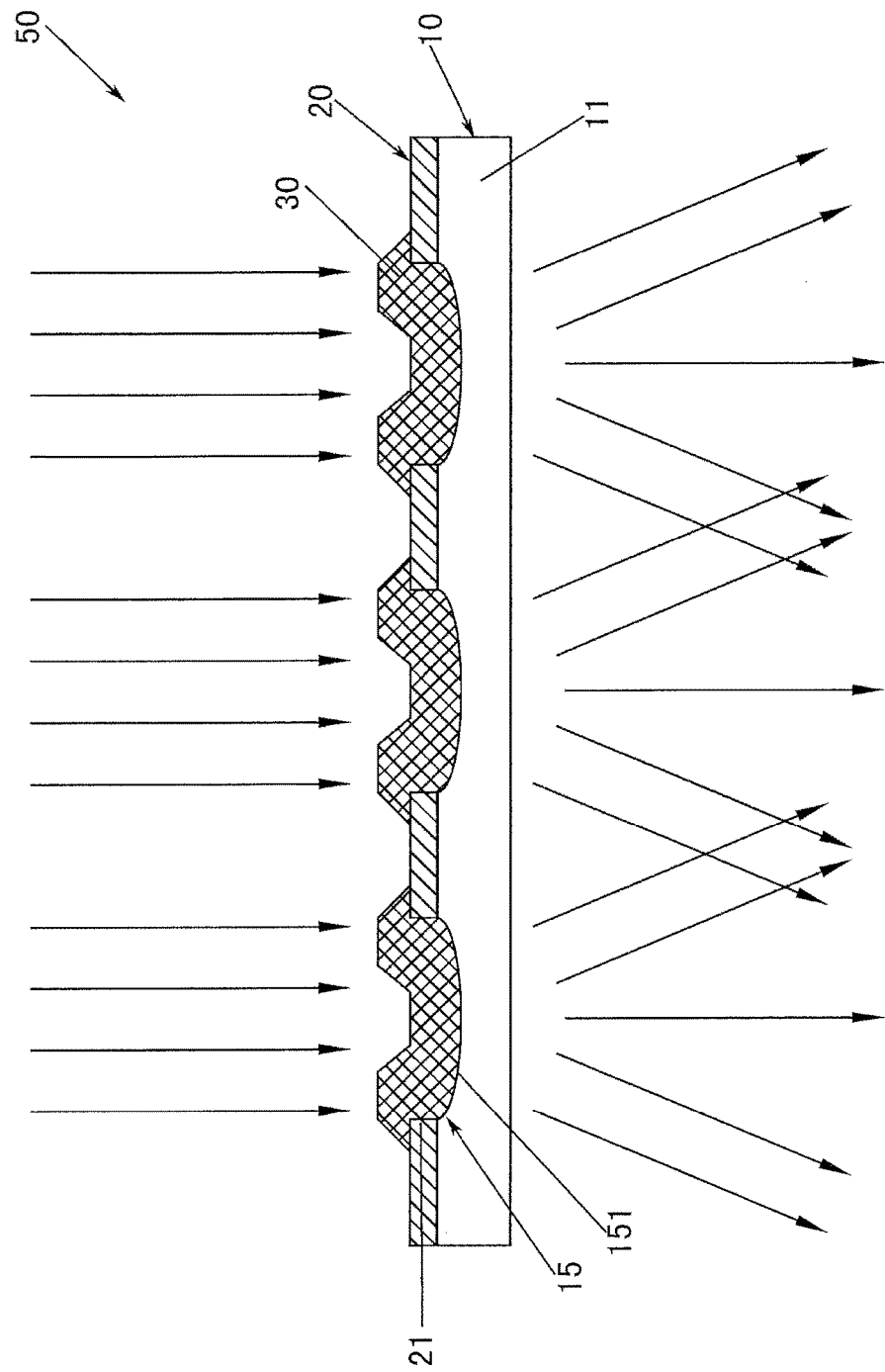
FIG. 17 is a schematic view of the color filter module and its light path according to an exemplary embodiment of the present invention.

According to an exemplary embodiment of the present invention, as shown in FIGS. 9, 10 and 17, the color filter module 50 further comprises a coating 20 formed as a black matrix and a plurality of through holes 21 formed in the coating 20 at positions corresponding to the plurality of recesses 151 respectively. An inner periphery of each through hole 21 is substantially coincident with that of a corresponding recess 151 when viewed in the direction substantially perpendicular to the substrate body 11.

According to another embodiment of the present invention, as shown in FIGS. 8, 11, 12, 13 and 18, the color filter module 50 further comprises a coating 20 formed as a black matrix and a plurality of through holes 21 formed in the coating 20 at positions corresponding to the plurality of recesses 151 respectively. At least a portion of an inner periphery of each through hole 21 is located inside an inner periphery of a corresponding recess 151 when viewed in the direction substantially perpendicular to the substrate body 11. Since at least a portion of the inner periphery of each through hole 21 is located within the inner periphery of a corresponding recess 151, it is possible to ensure that a light leaking will not occur.

According to some embodiments of the present invention, as shown in 10, 13, 17 and 18, at least a portion of each filter element 30 may be disposed in the corresponding recess 151, so that the size of the display device can be further reduced.

A method for forming a substrate module or a color filter module of a display device according to embodiments of the present invention will be described below.

Referring to FIGS. 1 to 20, the method comprises: step 100: providing a substrate 10; and step 200: forming a plurality of recesses 151 spaced apart from each other on a surface of the substrate 10 to form a plurality of optical devices 15. The optical devices 151 may be a plurality of concave lenses or prisms arranged into an array. By forming the optical devices 151 on the substrate itself, it is possible to simplify a process for forming the optical devices 15, so that an assembling process of the display device is simplified.

According to some embodiments of the present invention, as shown in FIGS. 2 to 7, the step of forming a plurality of recesses 151 spaced apart from each other on a surface of the substrate 10 to form a plurality of optical devices 15 comprises steps: forming a coating 20 on the substrate 20, and forming a plurality of through holes 21 in the coating 20; and forming a plurality of recesses 151 on a surface of the substrate 10 through the plurality of through holes 21 by etching. It is possible to allow the optical devices 15 to have more reliable and stable quality by forming the plurality of recesses 151 on the substrate 10 itself through etching. According to some embodiments of the present invention, the coating 20 is formed as a black matrix of the display device. By forming the optical devices 15 with the coating formed as the black matrix, the optical devices 15 may be formed only by adding a processing step, thereby saving cost and simplifying process.

Figure 6:
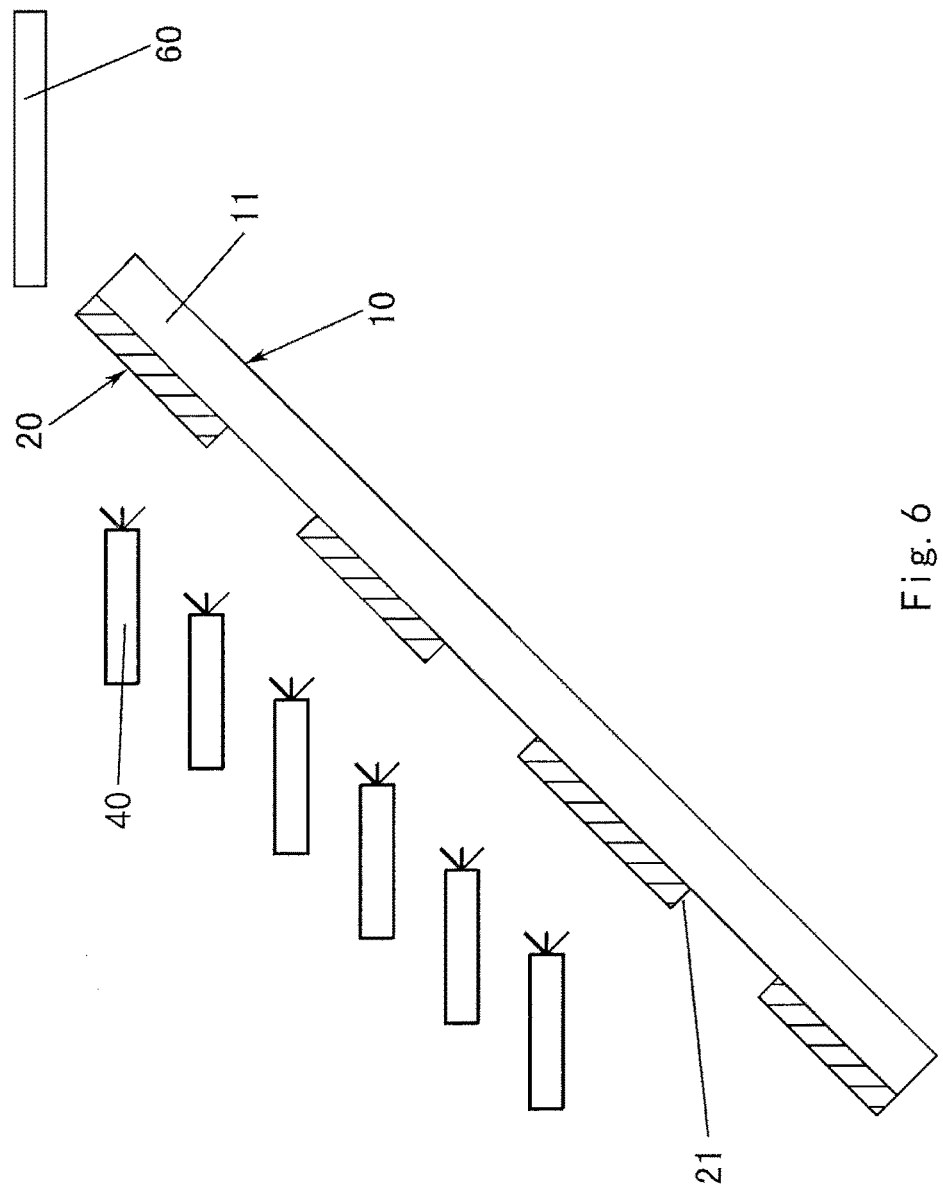
FIG. 6 is a schematic view of a system for forming optical devices on a substrate body itself according to an exemplary embodiment of the present invention.

According to an example of the present invention, as shown in FIG. 6, the etching step comprises supplying an etching solution for example by a liquid supply device 60 such as an etching solution supply tank from an upper edge of the substrate 10 in a state where a side of the substrate 10 formed with the coating 20 faces upwards and the substrate 10 is obliquely placed, so that the etching solution flows downwardly from the upper edge of the substrate 10 along a surface thereof.

Figure 7:
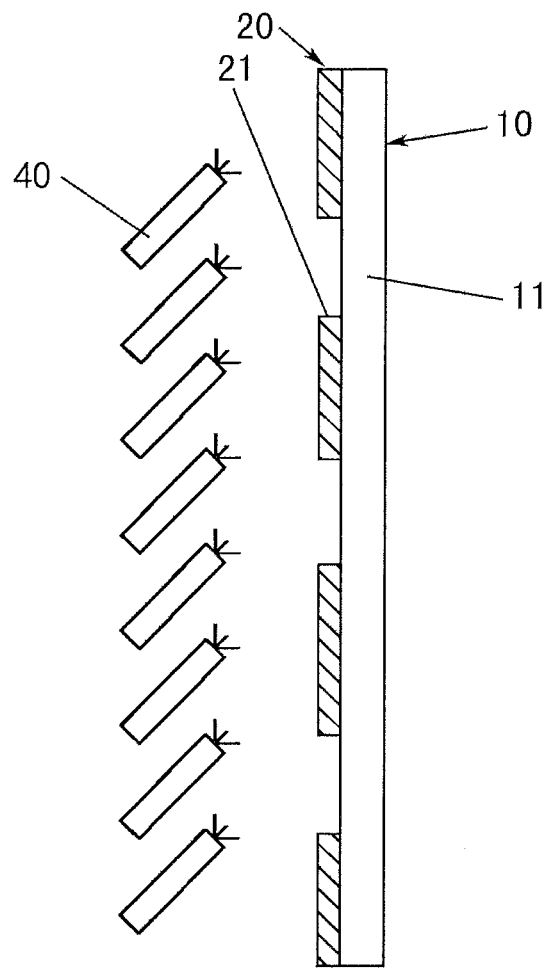
FIG. 7 is a schematic view of another system for forming optical devices on a substrate body itself according to an exemplary embodiment of the present invention.

According to another example of the present invention, as shown in FIG. 7, the etching step comprises supplying an etching solution for example by a liquid supply device 60 such as an etching solution supply tank from an upper edge of the substrate 10 in a state where the substrate 10 is substantially vertically placed, so that the etching solution flows downwardly from the upper edge of the substrate 10 along a surface thereof.

According to the embodiments of the present invention, as illustrated in FIGS. 6 and 7, the etching step further comprises injecting the etching solution toward the side of the substrate 10 formed with the coating 20 such that the etching solution in each through hole 21 is subjected to a predetermined pressure. A plurality of nozzles 40 may be used to inject the etching solution toward the side of the substrate 10 formed with the coating 20. An injection direction of each of the plurality of nozzles 40 is adjustable.

It is possible to ensure the quality of the recesses 151 through the above processes. For example, it is possible to ensure the quality of the recesses 151 formed by principle of capillarity.

Figure 8:
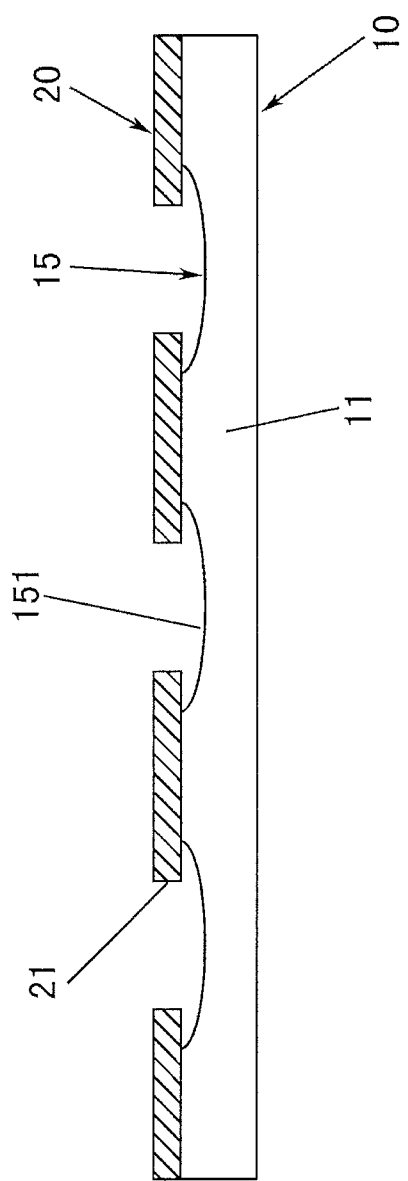
FIG. 8 is a schematic view of the glass substrate and the black matrix after performing the etching process according to an exemplary embodiment of the present invention.

According to the embodiments of the present invention, referring to FIGS. 8 and 9, the method further comprises a step of cutting away a portion of the coating 20 inside an inner periphery of each recess 151 when viewed in a direction substantially perpendicular to the substrate body 11 along an inner periphery of each through hole 21. It is possible to improve an aperture opening ratio of the display device by cutting away the portion of the coating 20 inside the inner periphery of each corresponding recess 151 when viewed in a direction substantially perpendicular to the substrate body 11 along the inner periphery of each through hole 21.

According to embodiments of the present invention, as shown in FIGS. 10 to 13, 17 and 18, the method further comprises a step of forming a filter element 30 at least within a space surrounded by each recess 151 and each corresponding through hole 21. It is possible to ensure that a light leaking will not occur in the substrate module manufactured by the above method.

Figure 11:
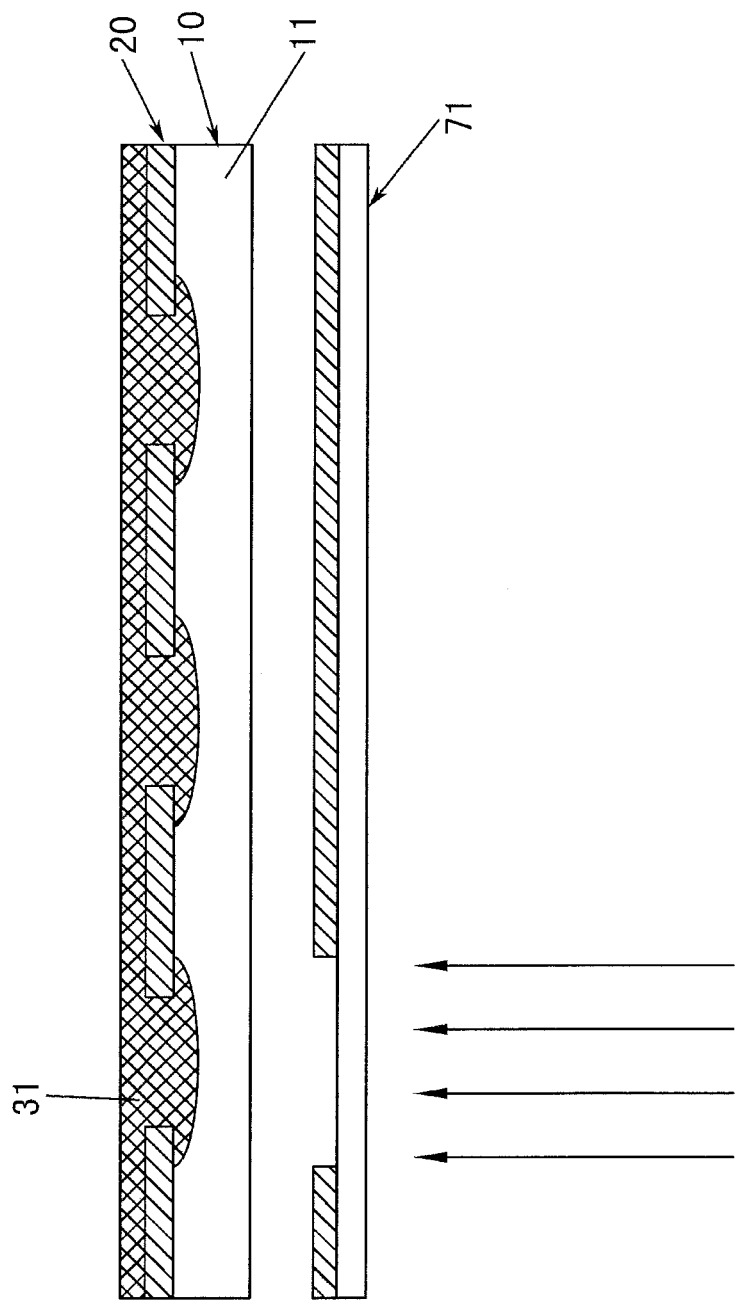
FIG. 11 is a schematic view showing exposing a pixel photoresist at a side of the substrate without the black matrix to form a filter element of one kind of color according to an exemplary embodiment of the present invention.

According to the embodiments of the present invention, referring to FIGS. 8 to 13, especially FIG. 11, the step of forming a filter element 30 comprises step of applying photoresist 31 onto a side of the substrate 10 formed with the coating so that the photoresist 31 is filled in the space surrounded by each recess 151 and each corresponding through holes 21; and irradiating the photoresist 31 at a side of the substrate 10 without the coating 20 to expose and develop the photoresist 31, thereby forming the filter element 30. By the above method, an upper surface of each filter element 30 is flatter and has less height difference, thereby reducing possibility of light leaking.

Although in the above embodiments, the recesses 150 are formed through etching, the recesses 151 may also be formed by other processes. For example, the recesses 151 may also be formed by a laser.

An example of the method according to the present invention will be described below with reference to the accompanying drawings.

Figure 2:
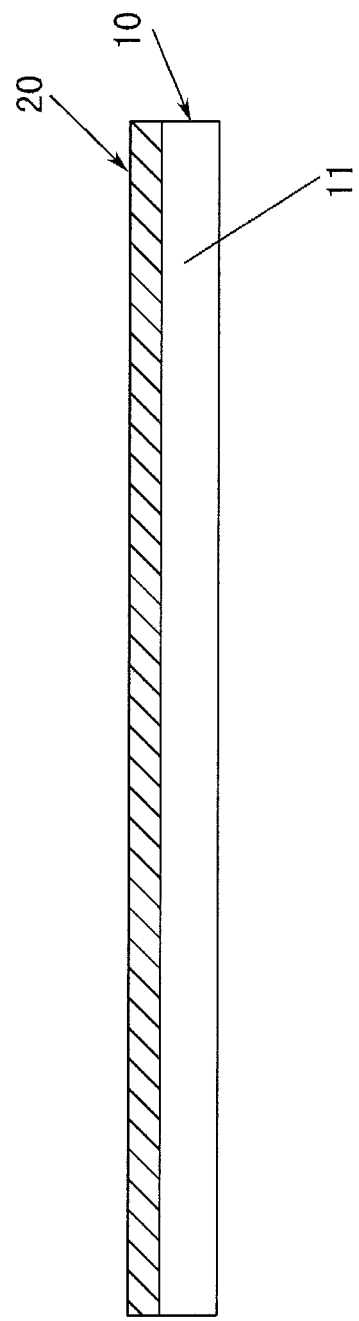
FIG. 2 is a schematic view of the glass substrate applied with a black matrix photoresist according to an exemplary embodiment of the present invention.
Figure 3:
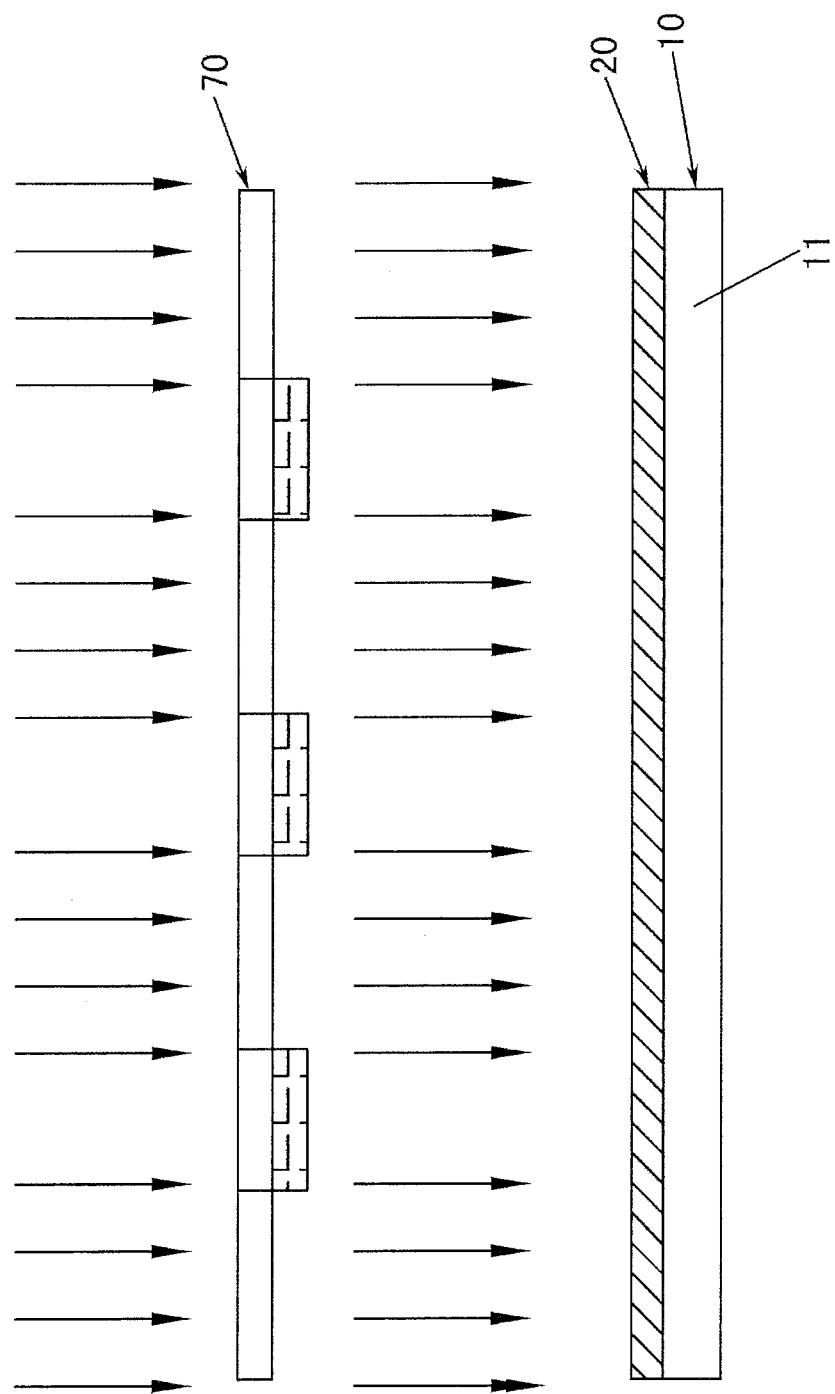
FIG. 3 is a schematic view showing exposing the black matrix photoresist by a mask according to an exemplary embodiment of the present invention.
Figure 4:
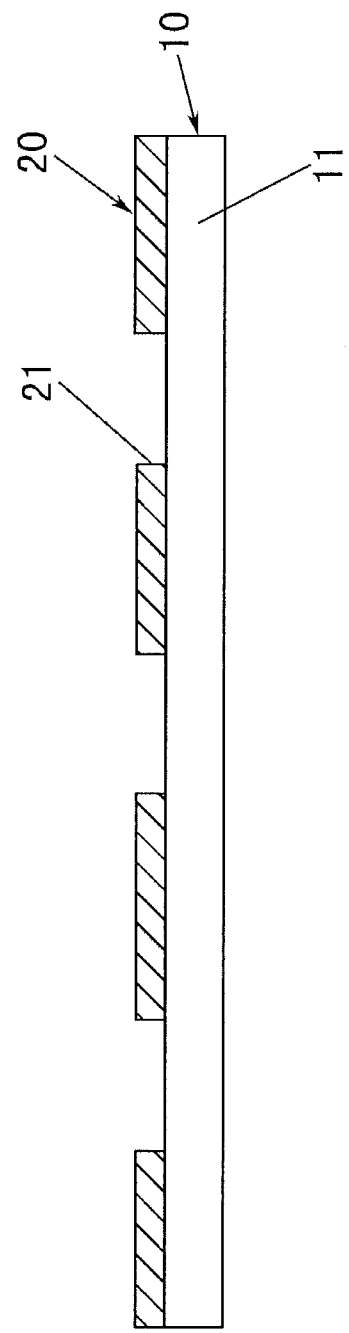
FIG. 4 is a schematic view of the developed and cured glass substrate and the formed black matrix according to an exemplary embodiment of the present invention.

As shown in FIG. 1, a substrate 10 is firstly prepared. The substrate 10 is made of glass or other transparent materials. Then, as illustrated in FIG. 2, the substrate 10 is uniformly applied with a black matrix photoresist on a surface thereof to form a coating 20. As shown in FIG. 3, the coating 20 is exposed with a mask 70. After the coating 20 is developed and cured, a black matrix layer having a plurality of through holes 21 is formed, as shown in FIG. 4.

As illustrated in FIGS. 5 to 8, an etching solution is supplied for example by a liquid supply device 60 such as an etching solution supply tank from an upper edge of the substrate 10 in a state where a surface of the substrate 10 formed with the coating 20 faces upwards and the substrate 10 is obliquely placed, so that the etching solution flows downwardly from the upper edge of the substrate 10 along the surface thereof. Alternatively, an etching solution is supplied for example by a liquid supply device 60 such as an etching solution supply tank from an upper edge of the substrate 10 in a state where the substrate 10 is substantially vertically placed, so that the etching solution flows downwardly from the upper edge of the substrate 10 along a surface thereof to perform an etching process, such that light transmitting regions (such as RGB sub-pixel regions) not applied with the black matrix are formed as recesses constituting concave lenses.

As an example, the etching process uses principle of capillarity.

Figure 5:
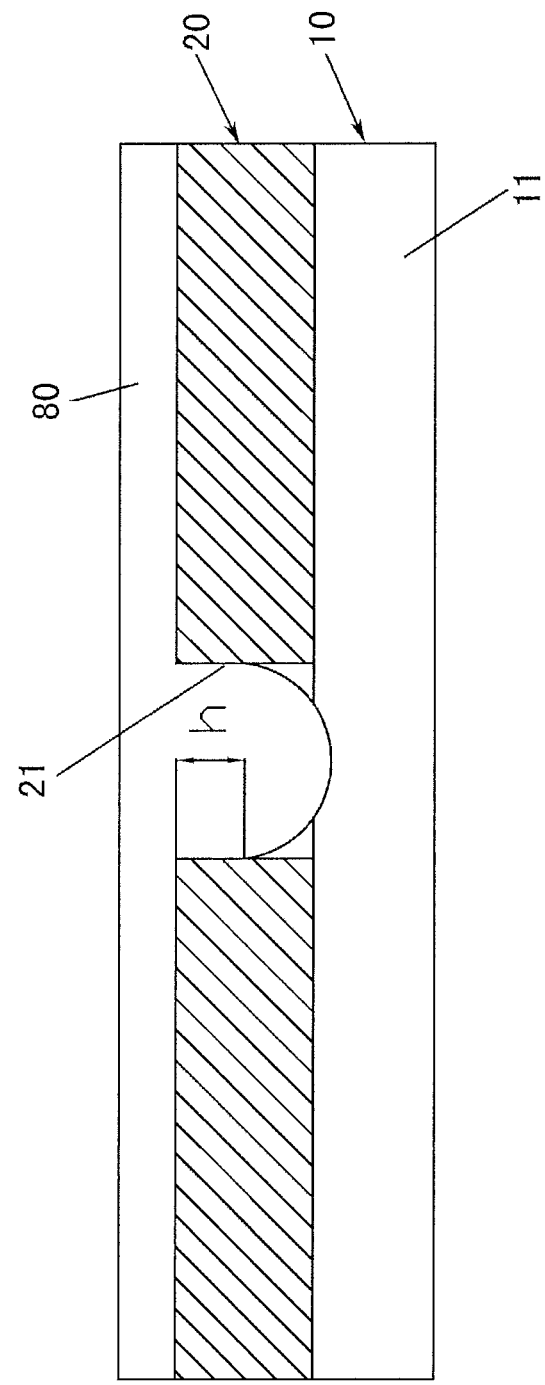
FIG. 5 is a schematic view of a principle of an etching process according to an exemplary embodiment of the present invention.

As shown in FIG. 5, each through hole 21 in the coating 20 has a width of an order of μm magnitude. A glass etching solution 80 has a shape shown in FIG. 5 in the through hole 21 in the coating 20 through capillarity. A dimension of this shape may be calculated by the following capillary theory formula:

$$h = 2\gamma \cos\theta / (\rho g r)$$

wherein h is a height of the etching solution 80 in the through hole 21 of the coating 20;

γ is a surface tension coefficient of the etching solution 80 able to be obtained by experiments and related to components thereof;

θ is a contact angle at which the etching solution 80 contacts with an inner wall of the through hole 21 in the coating 20, the contact angle may be obtained by experiments and related to the components of the etching solution 80;

ρ is a density of the etching solution 80;

g is an acceleration of gravity; and r is a radius of a capillary which is a half of a width of the through hole 21.

As shown from the above formula, it is necessary to form the recess 151 by controlling the parameter h, determine a height and size of the recess 151 by controlling the parameters γ, θ, ρ and r, and determine a structure of the desired recess 151 by preparing the components, a concentration of the etching solution and the size of the through hole 21 in the coating 20.

As shown in FIGS. 6 and 7, the liquid supply device 60 such as the etching solution supply tank can control parameters such as a concentration, a temperature, a supplying time of the etching solution. The nozzles 40 may exert a lateral force to the substrate 10 so that the etching solution within each through hole 21 is subjected to a predetermined press to control the depth and the shape of the corresponding recess 151. The injection direction or angle of each nozzle 40 is adjustable to obtain a recess 151 of desired shape.

As shown in FIG. 8, the recesses 151 as shown in FIG. 8 are formed through the etching process. As shown in FIG. 8, at least a portion of an inner periphery of each through hole 21 is located inside an inner periphery of a corresponding recess 151 when viewed in a direction substantially perpendicular to the substrate body 11. That is, a portion of the coating 20 protrudes into the inner periphery of each through hole 21. The fluidity of the etching solution makes the etching to extend toward outside of the through holes 21, so that a portion of the black matrix layer extends beyond the inner periphery of each through hole 21 towards a center of thereof.

During etching, in order to control the size of each recess 151, a mass loss of the glass substrate is calculated. That is, the mass loss of the glass substrate is a product of a cross section area of each recess multiplied by a length of each recess, the number of the recesses and a density of the substrate. A formula for calculating the mass loss of the glass substrate is provided as follows:

$$\Delta M = S_{recess} \times L \times n \times \rho_{substrate}$$

wherein $S_{recess}$ is the cross section area of each recess;

L is the length of each recess;

n is the number of the recesses; and $\rho_{substrate}$ is the density of the substrate.

In addition, if the glass substrate is used, since a main component of the glass substrate is $SiO_2$, HF acid may be selected as the etching solution. The etching solution, however, is not limited to the HF acid. Further, since the HF acid will not react with the black matrix photoresist, the black matrix photoresist can protect a portion of the glass substrate applied with the black matrix photoresist from being etched while serving as the black matrix. The specific chemical equation is provided as follows:

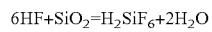

$$6HF + SiO_2 = H_2SiF_6 + 2H_2O$$

Then, an optical temperature, a concentration of the etching solution and an etching reaction time are determined based on relationships between a reaction time of the HF acid and the mass loss of the glass substrate, between a reaction rate and reaction temperature and between the reaction rate and a concentration of the HF acid.

For the relationships between a reaction time of the HF acid and the mass loss of the glass substrate, between a reaction rate and reaction temperature and between the reaction rate and a concentration of the HF acid, it may be referred to document (Ying S U, Research on Reaction Dynamics of Quartz Glass and HF Acid.[J], Journal of the Chinese Ceramic Society, 2004, 32(3), 287-293).

For example, assuming that the HF acid having the concentration of 1.4 mol/L is used, the reaction rate may be determined based on the relationship between the reaction rate and the concentration of the HF acid, the reaction temperature may be determined based on the relationship between the reaction rate and the reaction temperature, and the reaction time may be determined based on the relationship between the reaction time and the mass loss of the glass (Δm is known).

According to an exemplary embodiment of the present invention, as shown in FIGS. 8 and 9, a portion of the coating 20 inside the inner periphery of each recess 151 when viewed in the direction substantially perpendicular to the substrate body 11 is cut away along the inner periphery of the through hole 21 through a cutting process such as a laser cutting process. Thus, a structure shown in FIG. 9 is formed by that shown in FIG. 8.

According to an embodiments of the present invention, as shown in FIG. 10, filter elements 30 are formed on the substrate 10 as shown in FIG. 9. Each filter element 30 corresponds to one sub-pixel, thereby forming a color filter module 50. After forming the filter elements 30, if necessary, the color filter module 50 may be formed with a planarization layer and then formed with a transparent conductive layer.

Figure 12:
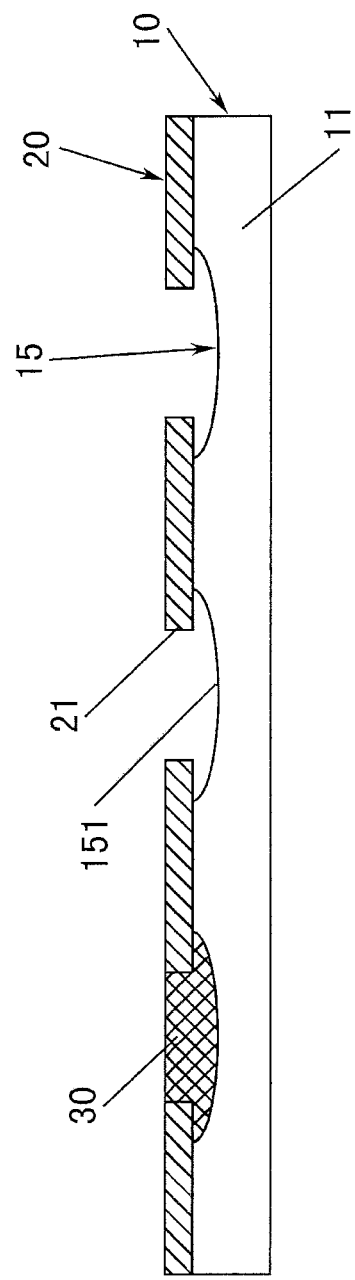
FIG. 12 is a schematic view of the glass substrate, the filter elements having one kind of color and the black matrix after a development process according to an exemplary embodiment of the present invention.
Figure 13:
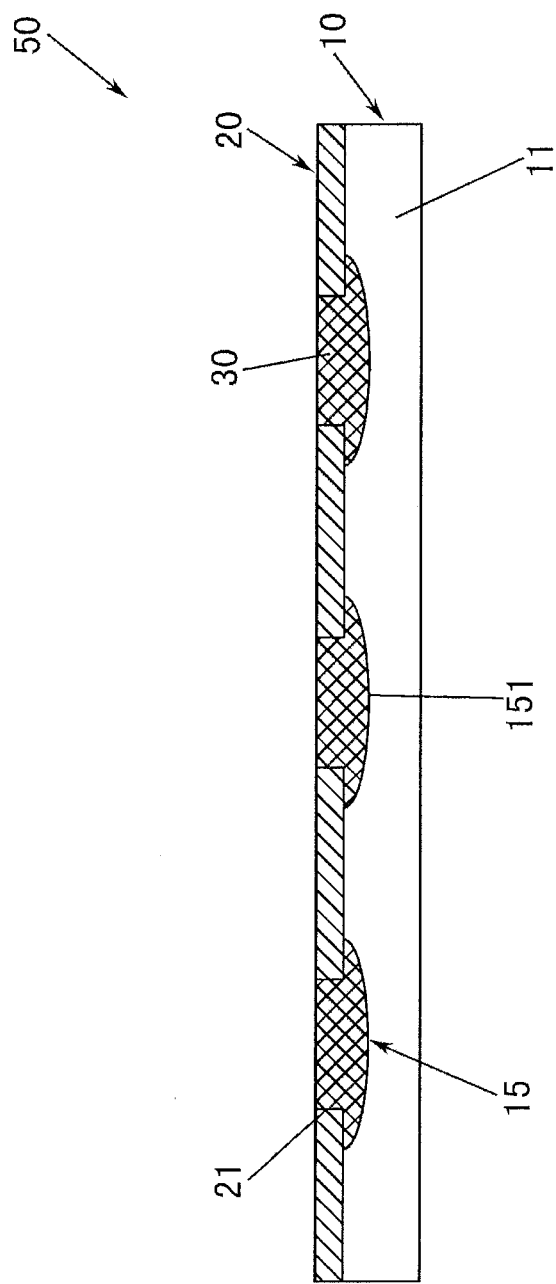
FIG. 13 is a schematic view of the color filter module after the development process including the glass substrate, filter elements having three kinds of colors and the black matrix according to an exemplary embodiment of the present invention.

According to certain embodiments of the present invention, as shown in FIG. 11, after forming the recesses 151 in the substrate 10, the etched glass substrate is cleaned and then is applied with a Red pixel photoresist 31 (the etched glass substrate may be firstly applied with Green/Blue pixel photoresist), and then is exposed with a mask 71. Specifically, the photoresist 31 is irradiated at a side of the substrate 10 without the coating 20 to expose the photoresist 31. As illustrated in FIG. 12, a red filter element 30 is formed by development. Similarly, the Green/Blue pixel photoresists are applied, exposed and developed to form the color filter module 50 as shown in FIG. 13.

In the above embodiments of the present invention, the portion of the coating 20 inside the inner periphery of each recess 151 when viewed in the direction substantially perpendicular to the substrate body 11 is cut away along the inner periphery of the through hole 21 through a cutting process such as a laser cutting process. Thus, aperture opening ratio is larger.

In the above embodiments of the present invention, in a case where the cutting process is not performed, the photoresist 31 is irradiated at the side of the substrate 10 without the coating 20 to expose the photoresist 31 so that the photoresist underlying the coating 20 is also cured. In this way, it is possible to reduce the possibility of light leaking.

As shown in FIGS. 14 and 15, in a conventional color filter module 50' shown in FIG. 14, the light leaking will occur if a filter element 30' shifts leftwards or rightwards in a through hole 21' of a coating 20' on a substrate 10'. However, in the color filter module 50 according to the embodiments of the present invention shown in FIG. 15, the light leaking will not occur even if a filter element 30 shifts leftwards or rightwards by a predetermined distance in the through holes 21 of the coating 20 on the substrate 10.

Figure 16:
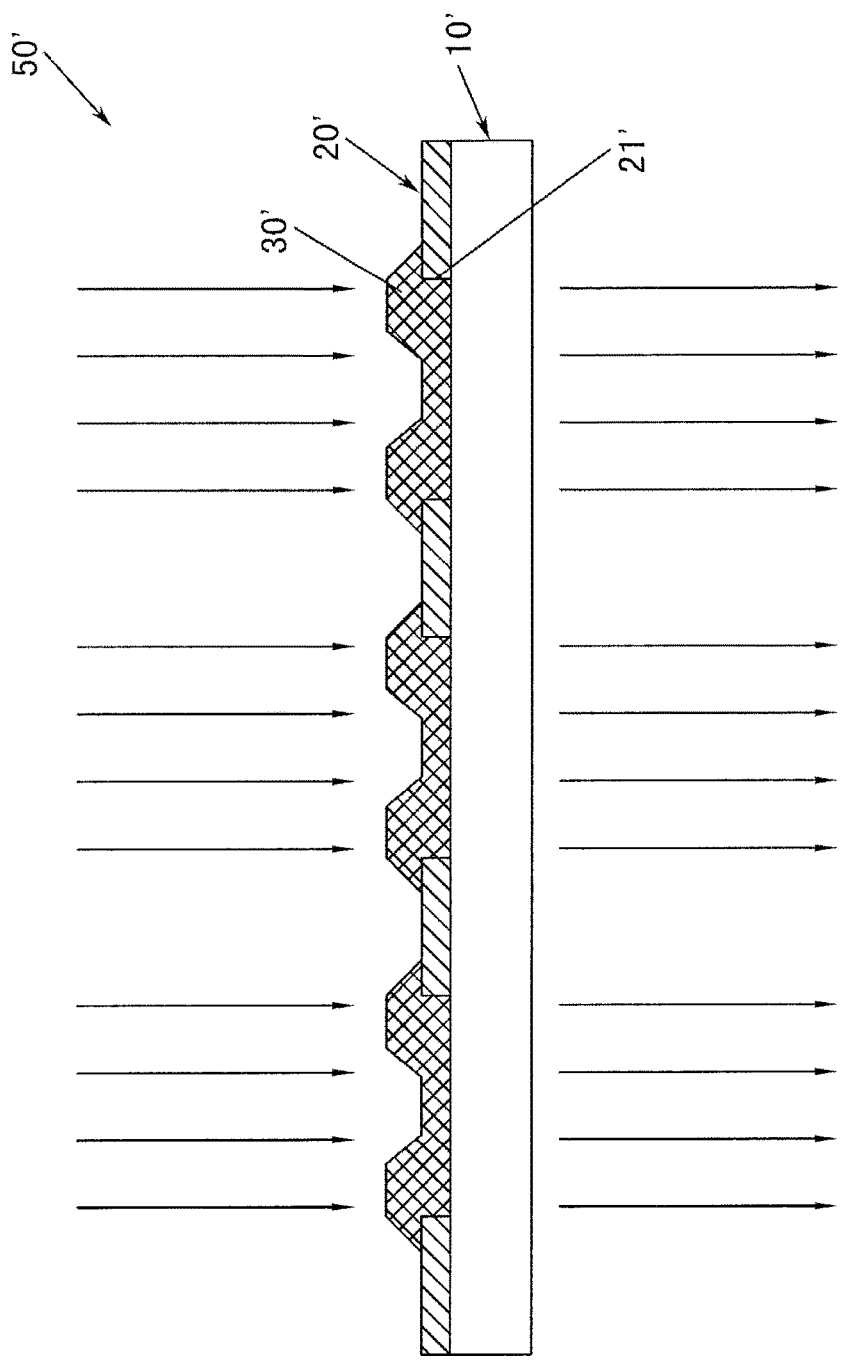
FIG. 16 is a schematic view of the conventional color filter module and its light path.
Figure 18:
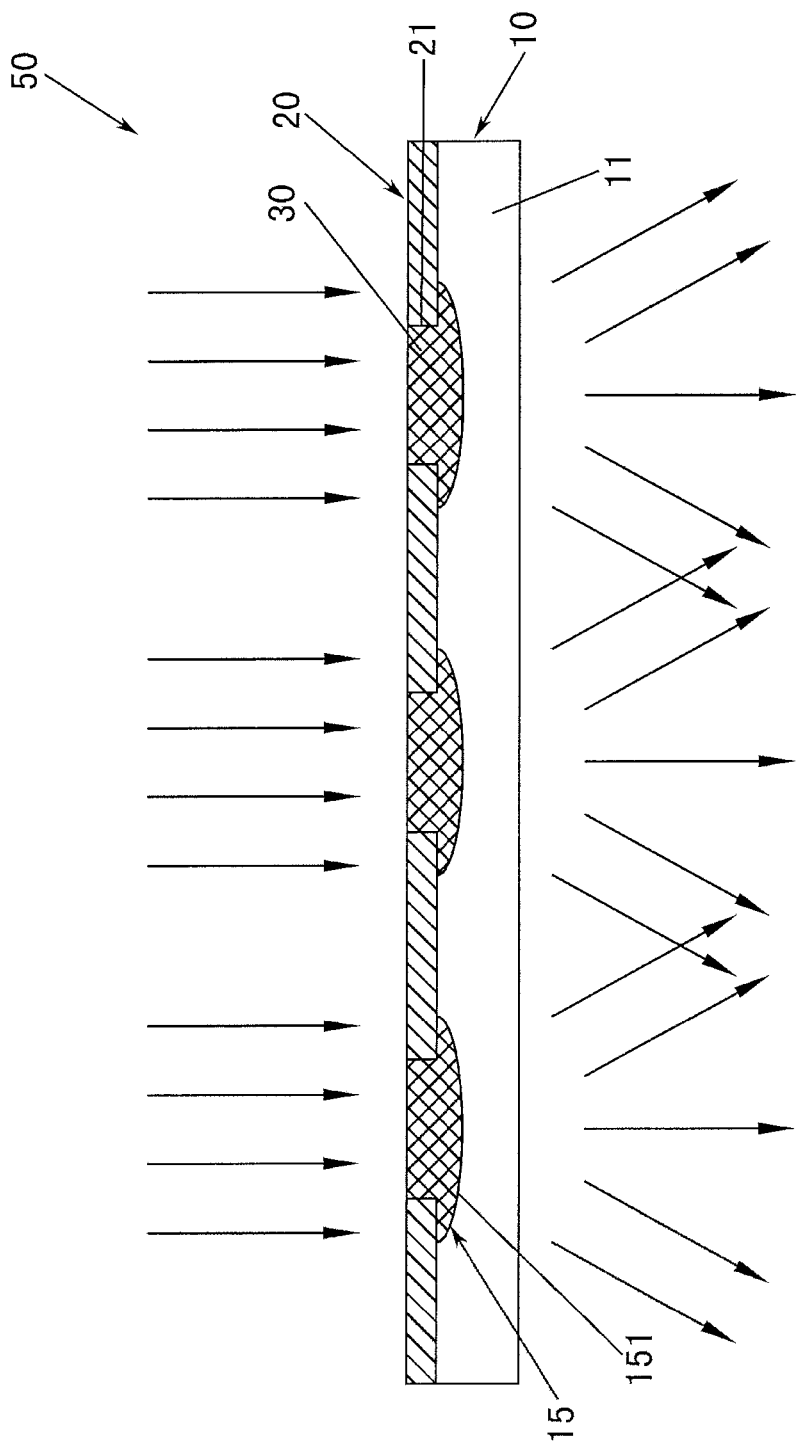
FIG. 18 is a schematic view of the color filter module and its light path according to another exemplary embodiment of the present invention.

FIG. 16 shows the conventional color filter module 50', and FIGS. 17 and 18 show the color filter module 50 according to the embodiments of the present invention. the conventional color filter module 50' comprises a substrate 10', a coating 20' (a black matrix layer) on the substrate 10', and filter elements 30' in through holes 21' in the coating 20'. As compared, each filter element 30 of the color filter module 50 according to the embodiments of the present invention has a flatter upper surface and a smaller height difference, thus has less possibility of light leaking, more divergent light rays and wider view of angle.

Embodiments of the present invention further provide a display device comprising the substrate 10 or the color filter module 50 for the display device as described above. The display device is applicable for various display modes such as a TN mode or a ADS mode.

According to the above embodiments of the present invention, through forming the optical devices 15 on the substrate body 11 itself, no separate optical module thus is necessary, thereby simplifying a structure of the display device, reducing a size and cost of the display device, and ensuring performance stability and reliability of the display device.

The above discussions are merely described the embodiments of the present invention, and the scope of the present invention is not limited thereto. Various changes or modifications may be made by those skilled in the art without departing from the spirit and scope of the present invention. Therefore, all equivalents should also fall within the scope of the present invention which is solely defined the appended claims.

What is claimed is:

1. A color filter module for a display device, comprising:
   a substrate, comprising:
   a substrate body; and
   a plurality of optical devices formed by a plurality of recesses, which are formed on a surface of the substrate body;
   a plurality of filter elements arranged to correspond to the plurality of recesses respectively, at least a portion of each filter element being arranged within a corresponding recess; and
   a coating formed as a black matrix and formed therein with a plurality of through holes corresponding to the plurality of recesses in position respectively.

2. The color filter module for the display device according to claim 1,
   wherein an inner periphery of each through hole is substantially coincident with an inner periphery of a corresponding one of the recesses when viewed in a direction substantially perpendicular to the substrate body.

3. The color filter module for the display device according to claim 2, wherein at least a portion of each filter element is arranged within a space surrounded by a corresponding one of the recesses and a corresponding one of the through holes.

4. The color filter module for the display device according to claim 1,
   wherein at least a portion of an inner periphery of each through hole is located inside an inner periphery of a corresponding one of the recesses when viewed in a direction substantially perpendicular to the substrate body.

5. A display device comprising:
   the color filter module according to claim 1.

6. The color filter module for the display device according to claim 1, wherein the plurality of recesses comprises a plurality of concave lenses or a plurality of prisms arranged into an array.

7. The color filter module for the display device according to claim 1, wherein the display device comprises a plurality of sub-pixels to which the plurality of optical devices correspond in position respectively.

8. The color filter module for the display device according to claim 1, wherein each recess has a substantially rectangular shape or an elongated strip shape when viewed in a direction substantially perpendicular to the substrate body.

9. A method for forming a substrate module of a display device, comprising steps of:
   providing a substrate; and
   forming a plurality of recesses spaced apart from each other on a surface of the substrate to form a plurality of optical devices;
   wherein the step of forming a plurality of recesses spaced apart from each other on a surface of the substrate to form a plurality of optical devices comprises:
   forming a coating on the substrate and forming ea plurality of through holes in the coating; and
   forming the plurality of recesses on the surface of the substrate through the plurality of through holes by etching; and
   wherein the coating is formed as a black matrix of the display device.

10. The method according to claim 9, wherein the etching comprises:
    supplying an etching solution from an upper edge of the substrate in a state where a side of the substrate formed with the coating faces upwards and the substrate is obliquely placed, so that the etching solution flows downwardly from the upper edge of the substrate along the surface thereof.

11. The method according to claim 10, wherein the etching further comprises:
    injecting the etching solution toward the side of the substrate formed with the coating such that the etching solution in each through hole is subjected to a predetermined pressure.

12. The method according to claim 11, wherein the etching solution is injected toward the side of the substrate formed with the coating by a plurality of nozzles.

13. The method according to claim 12, wherein an injection direction of each of the plurality of nozzles is adjustable.

14. The method according to claim 9, wherein the etching comprises:
    supplying an etching solution from an upper edge of the substrate in a state where the substrate is substantially vertically placed, so that the etching solution flows downwardly from the upper edge of the substrate along the surface thereof.

15. The method according to claim 9, further comprising cutting away a portion of the coating, which is located inside an inner periphery of each recess when viewed in a direction substantially perpendicular to a substrate body along an inner periphery of each through hole.

16. The method according to claim 9, further comprising forming a filter element at least within a space surrounded by each recess and each corresponding through hole.

17. The method according to claim 16, wherein forming a filter element comprises:

applying photoresist onto a side of the substrate formed with the coating so that the photoresist is filled in the space surrounded by each recess and each corresponding through hole; and irradiating the photoresist at a side of the substrate without the coating to expose and develop the photoresist, thereby forming the filter element.

* * * * *